United States Patent [19]
DeHaitre

[11] 4,087,666
[45] May 2, 1978

[54] SWITCH DEVICE FOR PRINTED CIRCUIT BOARD AND CIRCUIT STRUCTURE

[75] Inventor: Lon DeHaitre, Arlington Heights, Ill.

[73] Assignee: Abbott Screw & Mfg. Co., Chicago, Ill.

[21] Appl. No.: 764,819

[22] Filed: Feb. 2, 1977

[51] Int. Cl.² .............................................. H01B 3/40
[52] U.S. Cl. .................................................... 200/158
[58] Field of Search ........................................ 200/158

[56] References Cited
U.S. PATENT DOCUMENTS

| | | | |
|---|---|---|---|
| 2,064,736 | 12/1936 | Dahl | 200/158 |
| 2,145,041 | 1/1939 | Childers | 200/158 |
| 2,854,552 | 9/1958 | Gourerneur | 200/158 |
| 3,287,532 | 11/1966 | Boseler | 260/158 |

*Primary Examiner*—Steven L. Stephan
*Attorney, Agent, or Firm*—Silverman, Cass & Singer, Ltd.

[57] ABSTRACT

A switch device for a printed circuit board and the resulting circuit structure. The device comprises a mounting stud with a pilot threaded section and a working threaded section axially separated by an unthreaded shank and means for mounting the stud to a printed circuit board; and a hollow shell having a locknut mounted on its interior. The distance between the two threaded sections is greater than the interior threaded axial length of the locknut.

The circuit structure is intended to provide an optional switch between a first conductor on the upper surface of a printed circuit board and a second conductor on the bottom surface of the printed circuit board. The mounting stud is permanently secured to the circuit board in a hole formed in the board passing adjacent one of the conductors and close to but spaced from the other of the conductors. When the stud is mounted to the board it is soldered into an electrical conductive connection with the conductor that is adjacent the hole and protrudes from the other side of the circuit board, being thereby spaced from the other conductor. The assembled shell with locknut is screwed onto the pilot end of the stud, the threaded portion of the nut passing the pilot threaded section. The shell assembly freely moves to the working threaded section where continuing rotation causes the locknut thread to engage after which the shell assembly can be worked down toward the surface of the board. Screwing it tightly against the surface causes electrical contact to be established between the conductors on the top and bottom surfaces of the board through the enlarged axial end of the shell, stud and soldered connection. If the contact is not desired, the shell assembly can be backed off a couple of turns to lift its axial end off the conductor spaced from the stud.

An important feature of the invention is the captive effect of the unthreaded shank and the pilot threaded section combination which prevents the shell from vibrating free of the stud.

23 Claims, 12 Drawing Figures

U.S. Patent     May 2, 1978     Sheet 1 of 2     4,087,666
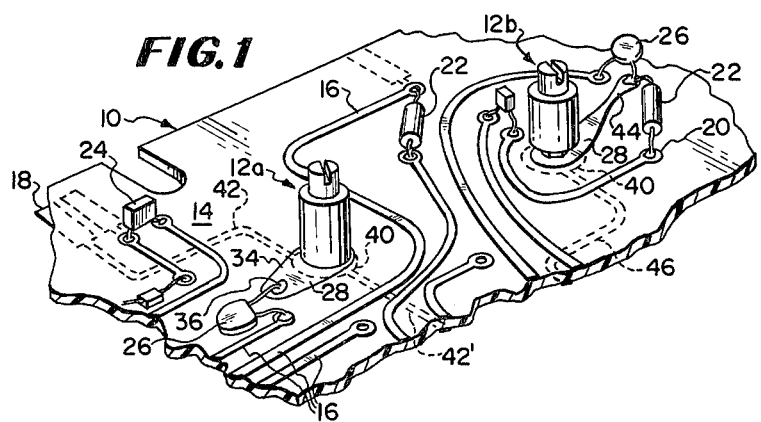
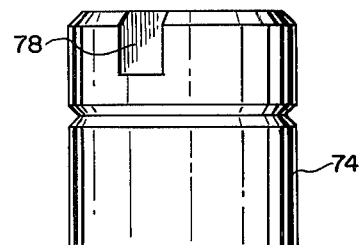
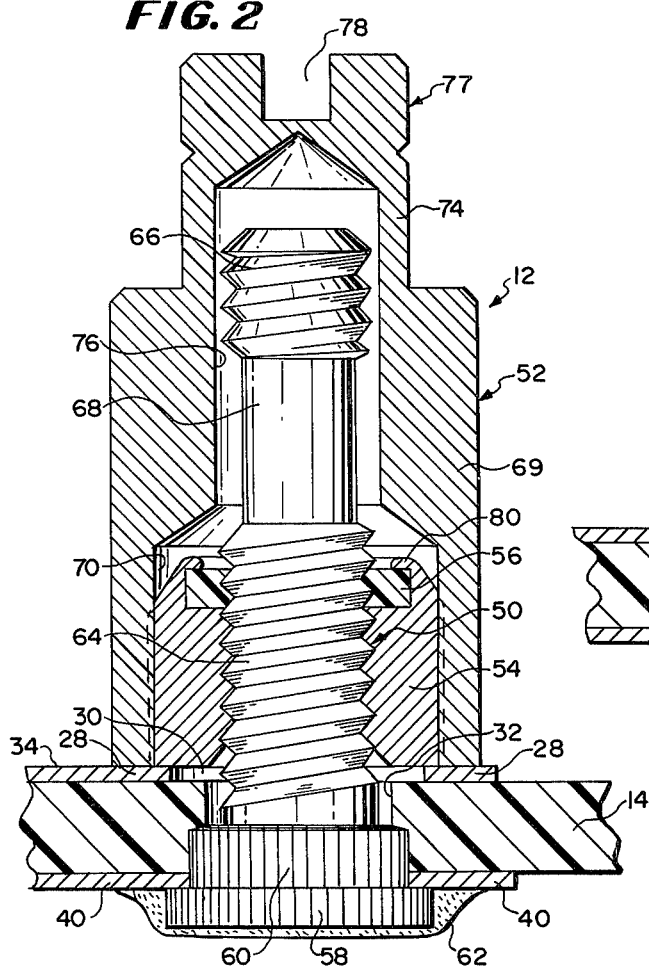

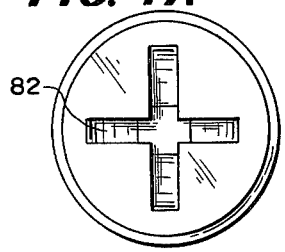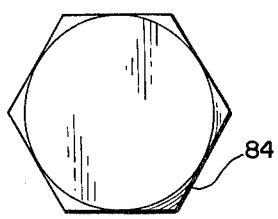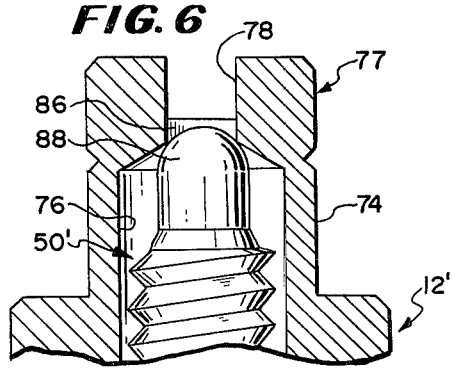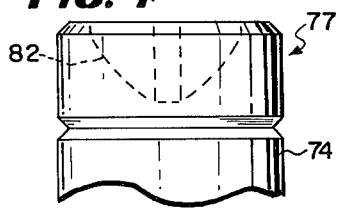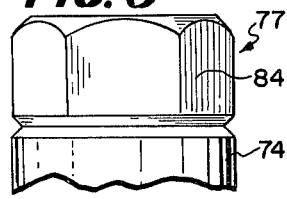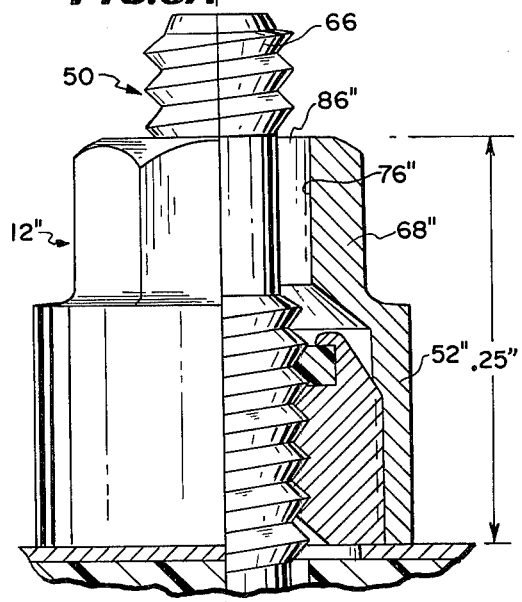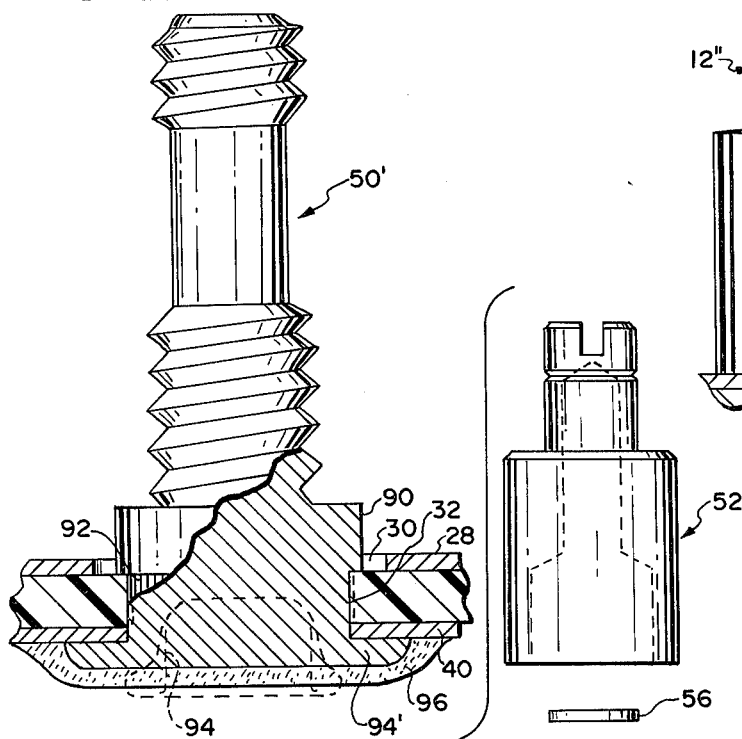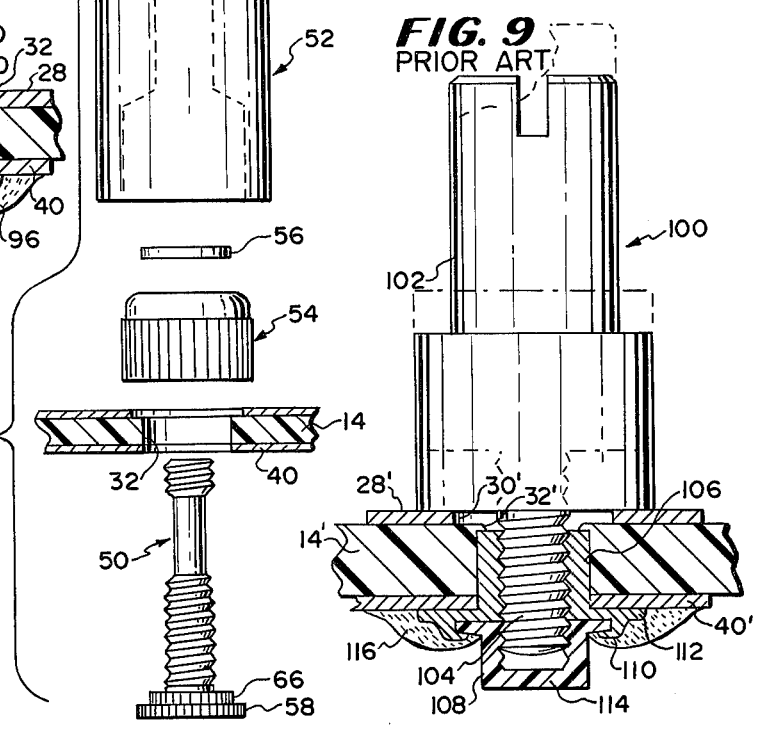

SWITCH DEVICE FOR PRINTED CIRCUIT BOARD AND CIRCUIT STRUCTURE

FIELD OF THE INVENTION

The field of the invention is generally printed circuits on insulating boards and specifically comprises switch devices for such circuits to enable changes in such circuits to be made by simple manual adjustment. The invention comprises a switching device which can be manufactured and sold as such as the resulting combination of circuit structure resulting therefrom.

BACKGROUND OF THE INVENTION

Printed circuit boards are well-known. Basically they comprise panels of insulating resin of various shapes and sizes having circuits printed thereon by known techniques. These circuits are formed of copper or other conductive metal that can be deposited through photography. They include mountings for components that are to be soldered permanently to the boards, these usually being small holes where the leads of resistors, capacitors, transistors and even transformers and electric lamps can be inserted. Soldering is effected by dipping or so-called wave soldering where the surface of the board opposite the side carrying the protruding components is passed through a flowing wave of solder. Obviously the board will normally have circuitry on both surfaces, and contacts along one or more edges to enable it to be connected into a large system.

Often these boards are intended to be inserted into narrow spaces where the bottom surface, that is, the one having the least protruding portions of the components, must clear another adjacent board.

The printed circuit boards are intended generally to be made by mass production methods and not to be serviced by varying the circuitry. In such apparatus utilizing these boards service is effected by locating the faulty board and substituting a known good one therefor.

In the manufacture of electronic apparatus utilizing extensive circuitry the technique of printed circuit board manufacture yields conveniences and economies which justify its use for situations where the circuit is to be modified after manufacture and assembly. There are situations where a given circuit board is to be used for several different purposes in the same or different systems, the functions differing from one another by the inclusion or exclusion of different parts of the circuit or even by including or excluding different components which have been built into the board during the process of automated production.

In such cases, the basic circuit may be capable of modification by simple switching provided by switch devices mounted on the circuit boards. Typically such a switch device will close a circuit by a technician screwing a metal member against the board bridging a pair of conductors on the same side of the board or establishing a connection between conductors on opposite surfaces of the board. To open the circuit one unscrews the metal member away from the board. The axial end of the member or a flange thereof performs the bridging function.

An important problem solved by the invention is the difficulty of the metal member getting free of the board, getting lost or dropping into parts of the circuit system and causing short circuits. For example, if such circuit boards with switching devices are included in a piece of equipment that is to be mounted in a vehicle, the shock and vibration could well cause a screw member having a female thread to work its way loose and fall off a stud or a member having a male thread to work its way out of a threaded socket.

Other problems exacerbating this one are those in connection with difficulty of manufacture and installation, complexity making use and manipulation inconvenient and the requirement that little space be occupied. These ancillary problems are solved by the invention in providing a highly efficient switch device that is simple to manufacture and install and which occupies very little space on the bottom of the board.

PRIOR ART

The following U.S. Pat. Nos. are typical of the patented prior art: 2,064,736 Dahl, Dec. 15, 1936, 2,854,552 Gouverneur II, Sept. 30, 1958, 3,524,960 Lohff, Aug. 18, 1970.

Of these, the only one relating to switches for printed circuits is U.S. Pat. No. 2,854,552. In that patent, a screw member is adapted to be screwed through a printed circuit board and has a contact establishing assembly carried by its head. All contacts must be made through the head assembly which has a special annular insulating disc carrying a ring on its bottom surface. To bring the contact of a conductor on the bottom of the board to the top for engagement with the ring requires a separate conductor in the form of an eyelet, for example passing through the board. The screw member has the majority of its length protruding from the bottom of the board in a troublesome manner and makes no contact on the bottom of the board. The shank of the screw has an unthreaded section which is intended to be positioned at the location of the board thickness to prevent the loss of the screw but in this condition there is still a substantial portion of the screw protruding from both sides of the board. Soldering through dipping or wave soldering techniques would cause considerable problems because solder would fill and bridge elements, would well up through holes and could not be accomplished with screws installed and protruding. The structure would be inoperative if the screw were soldered to a conductor on the bottom of the board; hence there is no teaching of a permanent soldered connection for one side of the switch on the board bottom.

A commercially available switch device which comprises prior art that is known is illustrated in FIG. 9 of the drawings and will be described in detail in connection therewith. Briefly, in that structure a blind end hat-shaped cap is formed out of a suitable synthetic resin such as nylon, is captivated by the flange into a metal nut having a knurled cylindrical exterior wall and the nut is pressed into a hole formed in a printed circuit board to present a threaded socket to the surface of the board having the conductor spaced from the hole. The plastic cap protrudes from the opposite surface and that portion of the nut protruding laterally is soldered to a conductor adjacent the hole. A screw member having an integral dependent threaded stud is screwed into the socket and when the body of the member engages against the board surface contact is made with the spaced conductor establishing electrical connection between the spaced conductor and the conductor on the opposite surface through the stud, nut and soldered connection. The plastic cap is necessary to prevent solder from entering the threads of the nut since the soldering is dip soldering. Wave soldering is difficult because of the cap protrusion. The structure is complex and difficult to assemble and provides no way of preventing loss of the screw member when turned to the off or open position.

SUMMARY OF THE INVENTION

The invention comprises a mounting stud of conductive metal which has mounting structure at its bottom end adapted for frictionally engaging the said end into a hole formed in a printed circuit board in conductive connection with a conductor on the bottom of the board. The remainder of the stud includes a working threaded section adjacent the mounting structure adapted to accommodate the threaded interior of a locknut of the nylon insert type thereon. There is a pilot threaded section at the axial or upper end of the stud opposite the mounting end that is spaced from the working threaded section by an unthreaded length or shank. The device includes a shell of conductive metal having a hollow interior chamber, a flat annular contact surface at its bottom axial end and a tool engaging formation at its upper axial end. A locknut of the nylon insert type is frictionally engaged in the chamber from the bottom thereof and prevents its threaded socket to the bottom axial end of the shell, its length being such that its thread including the portion extending through the nylon insert is of lesser axial length than the axial length of the unthreaded shank. The shank is of a diameter freely to pass through the threaded portion of the locknut. The length of the chamber is such as freely to accommodate the full length of the stud when the device is in use, but may be foreshortened if it is not desired fully to enclose the stud.

To install the device, the mounting structure is forced into a hole in the board which has a conductor adjacent that hole on the bottom of the board. At least a second conductor is near the hole on the top of the board but spaced therefrom by a distance that is sufficient to enable the intervening board surface to provide good electrical insulation between the protruding stud and the second conductor. The distance of the spacing is at the same time less than the outer radius of the shell, which is preferably cylindrical at its bottom axial end. There are two ways of mounting the stud to the board utilizing two forms of the invention. After mounting, both forms are permanently connected to the board and to the bottom conductor by soldering, preferably wave soldering. Such a small portion of the mounting means protrudes from the bottom of the board that wave soldering presents no problem.

When the stud is installed, the shell is screwed onto the pilot threaded section until the inserted locknut passes the same, moves freely past the unthreaded shank and engages the working threaded section. Thereafter, the shell can be screwed all the way down until its annular axial end engages the conductor on the top of the board or part way onto the working threaded section. In the first instance, there is an electrical connection between the conductors on the bottom and top surfaces of the board, while in the latter instance the connection is open.

During the use of the apparatus in which the printed circuit board is included, the shell cannot readily be removed without pulling it outwardly away from the board while at the same time unscrewing it in order to force it to engage the pilot threaded section. Thus, even if the shell vibrates free of the working threaded section it will not be capable of vibrating free of the stud but is held captive thereon because of the locking nylon insert.

BRIEF DESCRIPTION OF THE DRAWINGS

FIG. 1 is a fragmentary perspective view of a portion of a printed circuit board having two switch devices of the invention installed thereon, one being shown in closed circuit condition and the other being shown in open circuit condition;

FIG. 2 is a median sectional view taken through the switch device of FIG. 1 which is in closed circuit condition;

FIG. 3 is a view similar to that of FIG. 2 but being partially in section and partially in elevation and showing the switch device in open circuit condition;

FIG. 4 is a fragmentary elevational view of the upper end of a switch device like those of FIGS. 2 and 3 but showing an alternate form of tool engaging formation and FIG. 4A is a top plan view of the same;

FIGS. 5 and 5A are respectively similar to those of FIGS. 4 and 4A but showing still another alternate form of tool engaging formation;

FIG. 6 is a fragmentary sectional view through a modified form of the invention;

FIG. 6A is a fragmentary sectional view with portions shown in elevation of another modified form of the invention;

FIG. 7 is an exploded view of the switch device of FIGS. 2 and 3 showing the component parts in elevation and a portion of the printed circuit board in section;

FIG. 8 is a sectional view of a mounting stud of a somewhat different construction than that of the switch device of FIGS. 2 and 3 illustrating the manner in which the same is mounted to a printed circuit board; and FIG. 9 is a view partially in elevation and partially in section illustrating a form of prior art switching device referred to in the discussion of prior art given above.

DESCRIPTION OF THE PREFERRED EMBODIMENTS

The invention is applicable to most known types of printed circuit boards and renders a given board flexible in the circuit variations which can be effected with a board that is made in automated production. From one to a large multiple of switch devices may be incorporated into a board.

In FIG. 1 there is illustrated a fragment of a printed circuit board by way of example in which two switch devices are incorporated. The board is designated 10 and the switch devices of the invention are designated generally 12a and 12b. The board 10 is comprised of a plastic member 14 having printed lines of copper or other metal formed thereon, usually by photographic techniques. Lines are shown on the upper surface of the board and on the lower surface of the board, all of these lines being conductive and easily soldered.

The conductive lines take different geometric configurations and generally have an extremely small depth or thickness on the surface, being relatively wider to provide the current carrying capacity. Typical lines are shown at 16 on the upper surface. Termination of a line may be at a sliding contact 18 such as formed on a lateral edge on the bottom of the board 14 or at an enlarged spot 20 that is pierced to enable the lead from some electrical component to be inserted therein. Typical electrical components are resistors, transistors, capacitors and the like. Some of these are shown in FIG. 1 at 22, 24, 26.

For the incorporation of the switch device 12a into the circuit, the board will have terminals for conductors in the form of a relatively large spot as at 28 having a central opening 30 surrounding and spaced from a hole 32 that passes completely through the board 14. The spot 28 will have an elongate part 34 that is pierced at 36, for example to enable connection of a circuit component such as 26 thereto. The part 34 could also be a continuation of a line such as 16. There are many variations possible. The bottom of the board 14 has a spot 40 also surrounding the hole 32, but this spot is laid down in such a manner as to be immediately adjacent to the hole so that the switch device 12a may be permanently connected electrically to the spot 40. The spot 40 may be constructed somewhat like the spot 28 as desired, but in the illustrated example, it is permanently connected with a pair of conductor lines 42 and 42' that are laid onto the bottom surface of the board 14. Clearly when the switch device 12a is in circuit closed condition the lines 42 and 42' will be connected electrically to the condenser 26 and through the condenser to one of the lines 16. When the switch device 12a is in circuit open condition, the condenser 26 is out of the circuit.

In the case of the switch device 12a the illustration is intended to show the device in circuit closed condition with the shell of the device 12a screwed down. Switch device 12b shown in FIG. 1 is intended to be illustrated in circuit open condition with the shell screwed away from the surface of the board 14.

The spot 28 of the board 14 where the switch device 12b is located has an extension 44 on the top of the board by means of which the spot is connected to a network including a resistor 22 and a capacitor 26 and other connections. The construction of the spot 28 is the same as the construction of the spot 28, providing the clear space 30. The through opening 32 and the spot 40 on the bottom of the board 14 are also provided at this location. In this instance the line on the bottom of the board connected to the spot 40 is designated 46.

Inviting attention now to FIGS. 2 and 3, the switch device 12 of the invention is illustrated in enlarged scale. In FIG. 2 it is shown in circuit closed condition and in FIG. 3 it is shown in circuit open condition. The device 12 is formed of four parts, three of which are pre-assembled to provide the movable shell assembly and one of which provides the mounting stud. These parts are shown in exploded relationship before pre-assembly and before installation onto the circuit board 14 in FIG. 7 which should be referred to along with FIGS. 2 and 3 during the description which follows.

The switch device 12 of FIGS. 2, 3 and 7 comprises a central mounting stud 50, a metal hollow shell 52, a locknut body 54 and a synthetic resin insert or washer 56. The parts are preassembled first by incorporating the insert into the locknut body by techniques that are well-known and used to form such locknuts and then by pressing the locknut into the shell. The stud 50 is pressed into the hole 32 of the printed circuit board 14 and soldered in place on the bottom of the board. The shell assembly 52, 54, 56 is then screwed down the stud 50 to engage thereon and the mounting is complete. Use thereafter depends upon the desires of the circuit technician and the requiremnts of the circuit. He can either screw the shell assembly all the way down or leave it spaced from the upper surface of the board.

The mounting stud 50 is a screw machine formed article of some conductive metal and may be tin plated or the like to promote easy soldering. At its bottom end, the stud 50 has mounting means which, in the example of FIGS. 2, 3 and 6, are designed to enable the initial step of assembly to comprise pushing the stud body 50 through the hole 32 from the bottom of the board 14. There is an enlarged annular flange 58 that is knurled to provide axially extending grooves and a reduced diameter cylindrical section 60 that is similarly knurled. The diameter of the flange 58 is substantially greater than the diameter of the hole 32 while the diameter of the section 60 is only slightly larger than the diameter of the hole 32. Thus when the stud is pushed through the hole 32 from the bottom thereof, the knurling of the section 60 will bite into the inner surface of the hole forming a frictional engagement while the flange 58 will overlie and engage the metal spot 40 on the bottom of the board 14. The stud 50 is soldered in place by flood soldering the flange 58 in place as indicated at 62 thereby establishing the required electrical connection that is permanent insofar as the stud 50 is concerned.

The remainder of the stud protrudes from the hole 32 spaced from and hence not electrically connected with the spot 28. There is a working threaded section 64 and a pilot threaded section 66 separated from the working threaded section 64 by an unthreaded reduced diameter shank 68. The axial length of the working threaded section 64 is chosen to engage fully the locknut threads when the shell assembly 52, 54, 56 is screwed fully down for a purpose to be described. The pilot threaded section 66 is required to have only a few threads to enable the initial passage of the shell assembly 52, 54, 56 onto the stud 50 and to block free removal of the assembly as for example by vibration.

The shell is a formed article of some material that may be suitably plated with a conductive coating. There is an enlarged cylindrical section 69 that has a central chamber 70 of cylindrical configuration opening to the bottom axial end of the shell 52. This bottom end thus provides an annular axially facing edge 72 (see FIG. 3) that will electrically contact the upper surface of the spot 28 when the shell assembly 52, 54, 56 is screwed tightly down into circuit closed condition. The shell 52 has an integral reduced diameter extension 74 of the cylindrical body section 69 and an internal extension 76 of the chamber 70 that extends partially into the section 69 with the remainder in the section 74. The purpose for the chamber 76 is to accommodate the upper end of the stud 50 which of course will be moving vertically with respect to the shell 52 during the use of the device 12. The exterior of the reduced diameter section 74 is provided with tool engaging means 77, which in this case comprises a simple slot 78 for enabling a conventional screwdriver to be used to rotate the shell assembly 52, 54, 56.

The locknut 54 is of a type which has a nylon (Zytel, a DuPont synthetic resin) washer 56 locked into one end thereof so that the engagement of a threaded male member in the nut will require the threads to bite into and form threads in the washer 56. This provides a friction producing or locking effect which is well-known. The peened over portion of the locknut body 54 is shown at 80. Instead of the conventional hexagonal exterior, the body 54 is knurled on its exterior surface and the dimensions are chosen so that there is an interference fit with the interior cylindrical surface of the chamber 70. After the washer 56 is locked in place, the locknut body 54 is forced into the chamber 70, washer end first being inserted into the shell 52 permanently with its lower axial end preferably flush with the annular axially facing edge 72.

The assembly of the shell assembly 52, 54, 56 onto the stud 50 is a simple screwing of the same onto the threaded section 66 until this pilot threaded section 66 passes through the nut body 54 and past the nylon insert 56. If the board 14 is disposed such that the stud 50 is vertical, as soon as the nut and insert are passed, the shell assembly 52, 54, 56 will drop down the stud 50 as the unthreaded shank section 68 freely passes through the threaded center of the nut 54 and insert 56. The axial length of the distance between the pilot threaded section 66 and the working threaded section 64 is chosen so that the nut 54 may be freely and loosely disposed between the threads. Continuing with the installation, the shell assembly 52, 54, 56 is pushed further down and the turning action is continued to enable the screw thread of the nut body 54 to bite into the working threaded section 64. Thereafter in use the shall assembly 52, 54, 56 will always be left on the working threaded section 64. In screwing the assembly fully down to establish a circuit closed condition, the last few turns establishing contact will bring the locking action of the locknut into play by causing engagement of the threaded section 64 with the insert. The insert serves another important function as explained.

If the device 12 is in circuit open condition, it is possible for the shell assembly 52, 54, 56 to work its way off the working threaded section 64, that is, the nut 54 may become fully disengaged therefrom. When this happens the nut 54 is captured between the two threaded sections 64 and 66 and retained there loosely albeit securely. The reason for the captivation is that in order for the shell assembly 52, 54, 56 to work its way off the stud 50, two things must happen. First the thread of the threaded section 66 must engage and bite into the thread of the nylon insert 56 and second, the entire shell assembly 52, 54, 56 must be unscrewed past the nylon insert. Both of these contingencies are difficult to accomplish even manually let alone by vibration. On this account it is unlikely that the shell assembly 52, 54, 56 can ever fall off the stud 50.

FIGS. 4 and 4A show a variation of the tool engaging means 77. In this modification, instead of a simple slot the upper end of the section 74 is provided with a cruciform socket 82 which will accommodate popular types of screw drivers having a cruciform cross section driving end. FIGS. 5 and 5A show another variation which comprises a hexagonal outer configuration 84 enabling the use of a wrench in manipulating the device 12. Other tool engaging means could comprise special sockets for Allen wrenches, clutches and combinations of several types.

FIG. 6 illustrates a modified form of the invention 12' in which the tool engaging means, as for example the slot 78 is drilled out to provide a passageway 86 into the interior of the chamber 76. The operator of the device 12' can thus look into the axial end of the chamber 76 and see the upper end of the stud 50'. The stud may be of the same configuration and construction as the stud 50 of the previously described embodiment 12 or it can have its end painted a bright color or provided with a bright extension 88. The condition described as circuit closed is effected by screwing the shell assembly down onto the stud 50 as far as possible thereby bringing the upper end of the stud the closest that is possible to the upper end of the chamber 76. Since in the modification 12' the upper end of the chamber 76 is open, the operator will see the bright end 88 and thereby know that the circuit is closed. He can quickly glance at a number of these installations and tell from the presence or absence of the color through the passageway 86 whether they are in circuit open or circuit closed condition. Since the passageway 86 is narrow and the chamber 76 confined, there will be little reflected light entering and the bright end 88 will be very difficult to detect when it has been moved down in the chamber 76 indicating circuit open condition.

In FIG. 6A there is illustrated another form of the switch device of the invention, this one being designated 12" and being characterized by a relatively short shell assembly. Here the shell 52" differs from the shell 52 in that the upper portion of 52 is shortened leaving an opening 86" which is nothing more than the upper end of the chamber extension 76". The outside surface of the lower cylindrical body 68" is formed with a hexagonal cross section as shown at 84" to accommodate a hollow socket wrench of small size. Here, when the shell 52" is fully seated as shown in the drawing, most of the pilot threaded section 66 of the stud 50 will be exposed showing that the device is in circuit closed condition. When the shell 52" is backed off to place the device 12" in circuit open condition, the pilot threaded section will for the most part be withdrawn into the chamber extension 76". In all other respects the construction and operation of the device 12" is the same as the construction and operation of the device 12.

FIG. 7 illustrates the assembly of the device 12 itself and the assembly onto the circuit board 14. As mentioned, the nut body 54 is knurled on its exterior as shown and has the usual thin wall extension at its upper end which is spun or peened over to form the locking flange 80 (see FIG. 2) to hold the washer insert 56 in place. The steps of assembly are: form the locknut 54 with nylon insert 56 in production machinery, press the nut 54 into the bottom chamber 70 of the shell 52. Independently of the formation of the shell assembly 52, 54, 56 the stud 50 is pressed into the hole 32 from the bottom of the board 14 seating the flange 58 against the spot 40 and soldered in place on the bottom of the board. The shell assembly 52, 54, 56 is then screwed onto the upper end of the stud 50 as described.

FIG. 8 illustrates a modified form of stud 50' which has different mounting means on the bottom end thereof. In this case there is a stop flange 90 formed adjacent the bottom end of the stud 50' which has a diameter greater than the hole 32 but less than the inner diameter of the opening 30 in the spot 28. Below the stop flange there is a knurled cylindrical section 92 whose diameter is slightly larger than that of the hole 32 so as to enable an interference fit therewith. The stud terminates at its bottom end in an eyelet-type hollow rivet formation 94 whose external diameter is about the same as the hole and whose axial length is such that when the bottom end of the stud is pressed into the hole from the top thereof there will be a substantial portion of the hollow rivet formation 94 protruding past the spot 40. This is shown in phantom lines in FIG. 8. After the stud 50' has been pressed into place, the hollow rivet formation 94 is flared by a suitable swaging tool to form the locking flange 94' shown. Thereafter the locking flange 94' is soldered to the spot 40 as shown at 96.

The remainder of the stud and the shell assembly 52, 54, 56 and its operation and function are as described with the exception that the lower end of the nut 54 may have to have a slight countersink to be certain to clear the stop flange 90 so that there is assurance that the end 72 will engage and contact the spot 28 when the device is in circuit closed condition.

FIG. 9 is a view of prior art structure which has been briefly described. The device 100 is formed of a solid cylindrical body member 102 having a male threaded stud 104 protruding from its bottom axial end. There is a metal nut 106 having a knurled cylindrical outer wall that is pressed into a hole 32' in the board 14'. The upperspot 28' has a central opening 30' spaced from the hole 32' and the bottom spot 40' is immediately adjacent the hole. The metal nut 106 is threaded throughout its axial extent and has a hat-shaped nylon member 108 locked thereto by means of a peened or spun over flange 110. This flange is integral with another flange 112 that overlies the spot 40'. The dimensions of the interior of the member 108 are such that when a male screw member is threaded into the body of the nut 106 it will cut threads on the interior of the cylindrical portion of the member 108 thereby enabling the nut 106 and member 108 combination to act as a well-known locknut. The difference between this and the ordinary locknut is that the member 108 has a blind end 114. To assemble the device 100, the preassembled nut and insert are forced into the hole 32' and this presents a threaded female socket to the top surface of the board 14'. The flange 112 is then soldered in place by dip soldering, the presence of the blind end 114 preventing solder from running into the threads of the nut 106 and welling up to the surface of the board 14'. The resulting soldered connection is shown at 116.

It is noteworthy that the blind end 114 which is essential to prevent solder entry protruded almost 4 mm. from the lower surface of the printed circuit board in a practical example. This provides problems in soldering and lead trimming. As for lead trimming, in production this is done by moving a high speed saw over the bottom surface of the board spaced quite close to the board. This technique cannot be used in the case that the switch devices 100 are installed.

The invention provides a much better arrangement because a practical device as described herein and illustrated in FIGS. 2 and 3 as the switch device 12 had the maximum protrusion of the flange 58 from the bottom surface of the board 14 at less than 0.9 mm which would not exceed 1 mm even when covered with solder. Wave soldering is no problem and high speed lead trimming by means of circular saw is easily effected.

It is quite clear that the invention herein is capable of considerable variation in its details. The preferred embodiments are by way of example only. Reference to top, bottom, upper, lower, etc. are only made to indicate relative locations for convenience in the drawings and are not to be considered limiting. With respect to printed circuit boards there is always one surface which carries the electronic components on which the major part of the switch device is installed and from which it is manipulated. This is considered the top surface of the board, but the board may be installed in a system on its side or even upside down. Reference characters have been duplicated or primed in different views where deemed appropriate to indicate the same or similar components.

In order to establish the practical dimensions of the examples illustrated, the maximum diameter of the shell 52 of a switch device 12 built for use in a small circuit board was 6.35 mm. The axial length of the nut 54 before inclusion of the insert 56 was 3.9 mm and after inclusion and rolling over of the flange 80 was 3.5 mm. The printed circuit board was 1.5 mm thick and the printed lines were of the order of 0.1 mm thick or less. The overall length of the stud 50 was 11.8 mm. The other dimensions were in proportion for the most part and can generally be scaled from the drawings, but some exaggerations and nonproportional dimensions are used for clarity.

The length of the shell 52 overall as illustrated in one practical example was about 12 mm but it will be appreciated that the shell can be as long as desired. The only limitation is dictated by the axial length of the stud 50. The chambers 70 and 76 must be at least long enough to accomplish the functions described and provide the captive function.

The invention is intended to be defined in the appended claims whose language is to be interpreted within the confines of the patent law as broadly as justified to express the advance over the prior art.

What it is desired to secure by Letters Patent of the United States is:

1. A switch device for use in connection with a printed circuit board, the switch device comprising:
   A. a stud having a pair of male threaded sections comprising a pilot section and a working section separated by an unthreaded shank, mounting means at one end of the stud adjacent the working threaded section adapted for mounting the stud to a printed circuit board,
   B. a hollow shell having a bottom end,
   C. a locknut frictionally engaged in the shell and presenting a threaded socket to the bottom end of the shell,
   D. the shell adapted to be screwed onto the stud with the locknut passing first over the pilot threaded section, said unthreaded shank being of a diameter smaller than the threads of the locknut such that said locknut moves freely past the unthreaded shank and then engaging upon the working threaded section, the axial length of the unthreaded shank being greater than the axial length of the female thread of the locknut,
   E. the bottom end of the shell, when fully screwed down the working threaded section of the conductive stud, contacting the top surface conductor of the circuit board and thus completing on electrical connection from the bottom surface conductor, through the stud and the shell to the top surface conductor, and when partially unscrewed breaking the connection, the locknut, because of its diameter as compared to the diameter of the threaded sections of the stud, being captured on the shank if the shell inadvertently is moved free of the working threaded section.

2. A switch device as claimed in claim 1 in which the locknut includes an internal synthetic resin friction producing insert at an axial end thereof remote from the bottom end of the shell, the threads of the locknut being partially formed in the insert.

3. A switch device as claimed in claim 1 further including:
   a tool engaging formation on the upper end of said shell to enable said shell to be fully screwed down or to be unscrewed; and means for indicating when said switch is on in the fully screwed down position or off in the partially unscrewed position.

4. A switch device as claimed in claim 3 wherein said indicating means include:
a passageway through the upper end of said shell; and
said stud includes indicia on the top of said stud which may be seen through said passageway when said shell is screwed down to indicate said switch being on.

5. A switch device as claimed in claim 3 wherein said indicating means include:
said shell having a truncated upper portion with a central opening in said upper portion, said truncated shell having a height less than the height of said stud which will extend above a board into which said stud is adapted to be mounted, said height being such that the stud will extend through said opening when said switch is on, but said stud will be withdrawn into said shell when said switch is off.

6. A switch device as claimed in claim 1 wherein:
said shell has an internal hollow enclosed extension above said locknut which extension substantially encloses said stud when said shell is screwed down.

7. A switch device as claimed in claim 1 wherein said stud mounting means include:
a first knurled cylindrical section adjacent said working threaded section having a first diameter slightly greater than the diameter of a hole through a circuit board through which said threaded section is adapted to be forced, and
an annular flange adjacent said cylindrical section and terminating said stud on said one end, said flange having a second diameter substantially greater than said first diameter, adapted to engage the surrounding surface of said hole through which said stud is adapted to be inserted.

8. A switch device as claimed in claim 1 wherein said stud mounting means include:
an annular stop flange adjacent said working threaded section having a first diameter substantially greater than the diameter of a hole through a circuit board into which said stud is adapted to be mounted, but less than the diameter of an opening in the printed circuits on one surface of said board surrounding said hole through the board,
a knurled cylindrical section adjacent to said annular stop flange having a second diameter less than said first diameter but slightly greater than said diameter of said hole through said board; and
a hollow rivet formation adjacent said cylindrical section terminating said stud of a diameter substantially equal to the diameter of said hole through said board and of a length to extend beyond said hole through said board such that said rivet formation is adapted to be riveted to the side of said board opposite said one surface when said cylindrical section and said rivet formation are forced through said hole.

9. A printed circuit board and switch device combination comprising:
A. a printed circuit board having an insulating substrate with conductors on the top and bottom surfaces thereof,
B. a conductive stud mounted through a hole in the board and having its bottom end permanently secured to the substrate, the stud having a pilot threaded section and a working threaded section separated by an unthreaded shank,
C. a hollow shell having a bottom end,
D. a locknut with a female thread internally thereof frictionally engaged in the shell and presenting a threaded socket to the bottom end of the shell,
E. the shell adapted to be screwed onto the stud with the locknut passing first over the pilot threaded section, said unthreaded shank being of a diameter smaller than the threads of the locknut such that said locknut moves freely past the unthreaded shank and then engaging upon the working threaded section, the axial length of the unthreaded shank being greater than the axial length of the female thread of the locknut, and
F. the bottom end of the shell, when fully screwed down the working threaded section of the conductive stud, contacting the top surface conductor of the circuit board and thus completing an electrical connection from the bottom surface conductor, through the stud and the shell to the top surface conductor, and when partially unscrewed breaking the connection, the locknut, because of its diameter, as compared to the diameter of the threaded sections of the stud, being captured on the unthreaded shank if the shell inadvertently is moved free of the working threaded section.

10. A combination as claimed in claim 9 in which:
the locknut includes an internal synthetic resin friction producing insert at an axial end thereof remote from the bottom end of the shell, the threads of the locknut being partially formed in the insert.

11. A switch device as claimed in claim 9 further including:
a tool engaging formation on the upper end of said shell to enable said shell to be fully screwed down or to be unscrewed; and
means for indicating when said switch is on in the fully screwed down position or off in the partially unscrewed position.

12. A switch device as claimed in claim 11 wherein said indicating means include:
a passageway through the upper end of said shell; and
said stud includes indicia on the top of said stud which may be seen through said passageway when said shell is screwed down to indicate said switch being on.

13. A switch device as claimed in claim 11 wherein said indicating means include:
said shell having a truncated upper portion with a central opening in said upper portion, said truncated shell having a height less than the height of said stud which extends above said board, said height being such that the stud will extend through said opening when said switch is on, but said stud will be withdrawn into said shell when said switch is off.

14. A switch device as claimed in claim 9 wherein:
said shell has an internal hollow enclosed extension above said locknut which extension substantially encloses said stud when said shell is screwed down.

15. A switch device as claimed in claim 9 wherein the bottom end of said stud includes:
a first knurled cylindrical section adjacent said working threaded section having a first diameter slightly greater than the diameter of said circuit board hole, and an annular flange adjacent said cylindrical section and forming the bottom of said stud, said flange having a second diameter substantially greater than said first diameter, engaging the surrounding surface of said hole through which said stud is inserted and permanently secured to said substrate with solder.

16. A switch device as claimed in claim 9 wherein the bottom end of said stud includes:
- an annular stop flange adjacent said working threaded section having a first diameter substantially greater than the diameter of said circuit board hole into which said stud is mounted, but less than the diameter of an opening in the printed circuits on one surface of said board surrounding said hole through the board,
- a knurled cylindrical section adjacent to said annular stop flange having a second diameter less than said first diameter but slightly greater than said diameter of said hole through said board; and
- a hollow rivet formation adjacent said cylindrical section forming the bottom of said stud of a diameter substantially equal to the diameter of said hole through said board and of a length to extend beyond said hole through said board and said rivet formation is riveted to the side of said board opposite said one surface and further secured by solder.

17. A switch device intended to be mounted on a printed circuit board having a first conductor on the upper surface of the board and a second conductor on the bottom surface of the board, the switch device being mounted on the board and connected in such a manner that the user has the option of manipulating the switch between circuit open and circuit closed conditions whereby to open or establish electrical conduction connection between said first and second conductors, said switch device comprising:
- A. a mounting stud of conductive material having mounting means including an external flange at one end for mounting the same to a printed circuit board, the flange adapted to engage against the bottom surface of the board and adapted to be in direct contact with said second conductor provided on said bottom surface, the stud adapted to extend through a passageway provided in the board and be spaced from said first conductor on the upper surface of the board, the stud having an elongate body which is adapted to extend above the said upper surface and having a working threaded section adjacent the mounting means and a pilot threaded section spaced at the second end of the stud and separated from a reduced diameter shank capable of freely passing through a female thread that is the same size as the threaded sections,
- B. a shell assembly comprising a generally cylindrical member of conductive material having a hollow formation on its interior and a tool engaging formation at its upper end, the hollow formation opening at least to the bottom end and terminating at an annular axial contact edge of a diameter greater than that of the stud at the location where it is adapted to emerge from the upper surface and sufficient to contact the said first conductor if engaged against said upper surface, a locknut having an internal female thread the same size as said threaded section including a synthetic resin annular friction producing insert frictionally engaged within the hollow formation of the shell assembly and presenting a female threaded socket to the bottom of the cylindrical member, the axial length of the threaded portion of the locknut being such that when the shell assembly is fully engaged on the working threaded section there will be at least a portion of the thread of the working threaded section engaged in the resin insert, and
- C. the length of the shank being at least slightly greater than the axial length of the threaded portion of the locknut such that the shell assembly can be installed on the stud by screwing the same down the pilot threaded section until said section is passed after which the shell assembly will freely move relative to the shank and thereafter by continuing to screw the shell assembly onto the working threaded section, but in the removal of the shell assembly from the working threaded section by unscrewing, the locknut will be captured on the shank between threaded sections and not readily be withdrawn therefrom without rotating and pulling the same to cause reengagement with said pilot threaded section.

18. The switch device as claimed in claim 17 in which the resin insert is located at one end of the locknut and when the locknut is engaged within the said hollow formation the resin insert is at the inner axial end of the locknut such that in order to enable the shell assembly to move off the stud the first action must be the engagement of the pilot threaded section with the female threads of the resin insert and the second action must be the screwing of the male threads of the pilot threaded section through the female threads of the resin insert.

19. A switch device as claimed in claim 17 further including:
- means for indicating when said switch is in the circuit closed condition in the fully screwed down position or in the circuit open position in the partially unscrewed position.

20. A switch device as claimed in claim 19 wherein said indicating means include:
- a passageway through the upper end of said shell; and
- said stud includes indicia on the top of said stud which may be seen through said passageway when said shell is screwed down to indicate said switch being in the circuit closed condition.

21. A switch device as claimed in claim 19 wherein said indicating means include:
- said shell having a truncated upper portion with a central opening in said upper portion, said truncated shell having a height less than the height of said stud which will extend above a board into which said stud is adapted to be mounted, said height being such that the stud will extend through said opening when said switch is in the circuit closed condition, but said stud will be withdrawn into said shell when said switch is in the circuit open condition.

22. A switch device as claimed in claim 17 wherein:
- said shell has an internal hollow enclosed extension above said locknut which extension substantially encloses said stud when said shell is screwed down.

23. A switch device as claimed in claim 17 wherein said stud further includes:
- a first knurled cylindrical section between and adjacent said working threaded section and said external flange having a first diameter slightly greater than the diameter of said passageway adapted to be forced into said passageway, and
- said external flange having a second diameter substantially greater than said first diameter.

* * * * *